Nov. 28, 1961 W. M. BUSKES 3,010,389

PHOTOGRAPHIC TRANSFER PRINTING PLATES

Filed June 29, 1954 2 Sheets-Sheet 1

INVENTOR
WILLEM MARIE BUSKES

BY

Pollard, Johnston, Smythe & Robertson

ATTORNEYS

Nov. 28, 1961 W. M. BUSKES 3,010,389

PHOTOGRAPHIC TRANSFER PRINTING PLATES

Filed June 29, 1954 2 Sheets-Sheet 2

INVENTOR
WILLEM MARIE BUSKES

BY

Pollard, Johnston, Smythe & Robertson

ATTORNEYS

United States Patent Office 3,010,389

Patented Nov. 28, 1961

3,010,389
PHOTOGRAPHIC TRANSFER PRINTING PLATES

Willem Marie Buskes, Waterleidingsingel 27, Venlo, Limburg, Netherlands

Filed June 29, 1954, Ser. No. 440,176
12 Claims. (Cl. 101—149.2)

The invention relates to a process for producing graphic prints, starting from an existing original. In the preparation of the printing plate necessary for this purpose, a light-sensitive sheet is imagewise exposed in accordance with an original from which the graphic prints are to be made. The exposed surface of the sheet is pressed against a receiving printing plate so that matter from the exposed sheet is transferred imagewise to the surface of the receiving printing plate and the two surfaces are then separated from one another.

The present invention relates more particularly to new printing plates of the character obtained by use of the aforesaid photographic transfer process.

This application is a continuation-in-part of my copending United States application Serial No. 341,197, filed March 9, 1953, now abandoned.

According to the present invention new printing plates having advantageous properties are produced by a process which comprises the steps of imagewise exposing a light-sensitive sheet comprising a light-pervious support, a screen carried on said support and consisting of screen parts substantially impervious to actinic light alternating with screen portions pervious to actinic light, there being substantially no transition between said screen parts and said screen portions, said screen parts containing hydrophobic matter, and light-sensitive matter located on the side of the screen parts remote from the support, said light-sensitive matter being substantially free from grains scattering actinic light and being such that its exposure to light alters the transferability to another support of screen part matter; pressing the exposed surface of the said sheet into contact with the surface of a receiving printing plate to effect transfer of screen part matter in transferable image portions from said sheet to said receiving plate, at least one of said surfaces being wetted before they are pressed together; separating the said surfaces; subjecting the printing plate thus obtained to a finishing operation to render it suitable for the production of graphic prints; and making graphic prints therefrom. In a transferable image portion screen parts may be wholly or partially transferred.

On the printing plates the portions covered with hydrophobic screen part matter are greasy printing ink-receptive. If the screen part matter is strongly hydrophobic and is non-porous or only slightly porous, the transfer may sometimes be somewhat difficult, but the transfer may be promoted by using higher pressure or other means.

By transferring with the aid of water, the hydrophobic screen parts remain intact during the transfer operation, so that sharp image portions are formed on the printing plate. On prolonged planographic printing the printing plate will have little tendency to line-broadening. The image portions may form a good resist for etching. In the process of the invention, as in United States Patent No. 1,618,505, the sensitizing of printing plates is unnecessary. Accordingly, in the finishing operation no matter (e.g. unexposed matter) needs to be removed from the printing plate, generally a somewhat tedious operation for those who are not particularly skilled in photomechanical work. In the known process of planography such an operation may in some few cases be avoided, but only when the planographic printing is carried out in the dark. It is one of the merits of the process of the invention that it considerably simplifies the obtaining of planographic printing plates, and the invention thus brings photomechanical processing more within the reach of the unskilled. The process of the invention is particularly valuable when applied to the offset process which, in offices and the like, is carried out by relatively unskilled personnel. In so far as the copying from the original is carried out on the principles of screen reflectography, the process of the invention yields non-laterally reversed offset prints.

An especial advantage of the invention is that the image present on the printing plate after transfer (even before finishing) is nearly always very easy to retouch. Accordingly, retouching will preferably be carried out between transfer and finishing. In general the possibility of such an easy retouch does not exist in processes using sensitized printing plates.

The screen parts may be formed from various materials. They must bring about the imperviousness to light necessary for screen reflectography and may best be summarized under the known term of "pigment." Soot, graphite, ochre, white-lead, barite, and titanium dioxide, are among the most usual pigments for obtaining good covering power. In the screen parts, they are usually mixed with one or more binders, such as asphalt, wax, oils, polymers, cellulose derivatives, gelatin, gum, proteins, e.g. casein, and cellulose. When the "pigment" is hydrophobic per se, the binder may be hydrophilic; when this is not the case, the binder may be hydrophobic, or other hydrophobic matter may be incorporated.

Since the light-sensitive matter should be substantially free from grains scattering actinic light, silver halide emulsions, other than so-called Lippmann emulsions, are not considered for the process of the invention on practical grounds.

The finishing of the printing plate referred to above may consist in etching the open portions of the plate for intaglio printing or in deepening the open portions by etching and/or mechanical means, the transferred image portions serving as a resist. When the printing plate is to be used for the making of planographic prints, the finishing operation may consist in making the open portions of the printing plate more water-receptive before inking. With zinc and aluminium plates this may be achieved, for example, by treating them with a "fixing" solution, for example a solution of phosphoric acid and gum arabic.

Examples of other finishing treatments for planographic printing plates are the following: The portions of a metal printing plate not covered with transferred matter may be etched chemically or electrolytically in order to make them more water-receptive; for the same purpose, a layer of another metal may be formed on the open portions. If, however, for example, copper is deposited on the open portions of a planographic steel plate, and the transferred matter is subsequently eliminated, a printing plate is obtained in which the portions corresponding to the transferred portions are water-receptive, whilst the portions corresponding to the non-transferred portions are greasy printing ink-receptive. By this finishing operation the selective receptiveness of the printing plate is reversed.

When the printing plate is a bi-metal plate with a greasy printing ink-receptive upper layer, finishing is achieved after the transfer by treating the surface of the plate with a chemical which takes the thin upper metal layer from the bi-metal plate. In this procedure the transferred matter functions as a resist. It may remain on the printing plate, or be removed since the upper metal layer of the bi-metal plate is greasy printing ink-receptive per se. In another finishing operation, which is analogous to a well-known reversal process, the transfer image on a water-receptive printing plate may, after having dried, be rubbed over or coated with an asphalt solution and then dried. Thereupon the transferred matter is eliminated from the surface, so that the original receiving surface (which is water-receptive) will eventually reappear in those portions which immediately after the transfer were covered with transferred matter.

In the following description, for the sake of simplicity, the term "transfer" is used mainly in a generic sense. This term is thus used for direct, indirect, selective, bodily, first, second, and further transfer, and for transfer of a remnant image. Wherever not otherwise defined, the term "transfer" implies transfer at room temperature.

Examples of plates denoted by the term "receiving printing plate" are a bi-metal plate (e.g. a steel plate having on its surface a thin layer of copper), a lithographic stone, a grained aluminium, zinc or steel plate, paper specially made for planography, an aluminium plate carrying a water-receptive oxide layer and a plastic sheet having a water-receptive surface, such as a superficially deacylated cellulose ester sheet.

Wetting is preferably effected with water. However, aqueous solutions (for example of salts, wetting agents or alcohol), which behave like water, may be used. Other liquids are described in the examples which follow.

In order to make the process more reliable and more accurately adjustable to the screen sheet materials and receiving printing plates used, which may be of various kinds, it is advisable to combine the operations of wetting and pressing-together in one single step. An apparatus for this is described later herein.

The invention will now be described with reference to the accompanying drawings which illustrate schematically specific embodiments of the materials and apparatus used in the practice of the invention. In these drawings.

In the drawings, corresponding parts are always designated by the same reference numbers.

Figure 1:
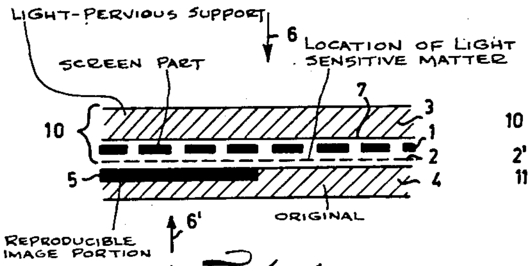
FIG. 1 shows the structure of a light-sensitive screen sheet for use in the process according to the invention, in contact with an original.

In FIG. 1 (diagrammatic cross-section) 1 is a screen part; 2 indicates the location of the light-sensitive matter (it may also be present in the screen parts); 3 represents the light-pervious support, and 4 the original with the dark portion 5. The elements 1, 2, and 3 together form one unit, to wit a light-sensitive screen sheet 10. Original and screen sheet are in close contact with one another. However, for clearness' sake, this close contact, as in some other figures, is not shown. When making a screen reflex copy, the light is incident in the direction of the arrow 6. When original 4 is a tracing, the light may be incident in the direction of arrow 6'.

Figure 2:
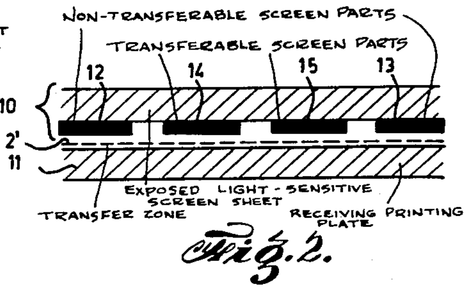
FIGS. 2 and 3 illustrate the procedure on transfer.

FIG. 2 is a diagrammatic cross-section of a light-sensitive screen sheet 10, which after the imagewise exposure according to FIG. 1 has been brought into wet contact with a receiving printing plate 11. The transfer zone is diagrammatically indicated by the dotted line 2'. For clearness' sake in this figure, as in FIG. 3, the light-sensitive matter is not shown, but only the support of the screen sheet; the receiving printing plate, and the screen parts. It is assumed that after the imagewise exposure the screen parts 12 and 13 are not transferable, and that the screen parts 14 and 15 are transferable.

Figure 3:
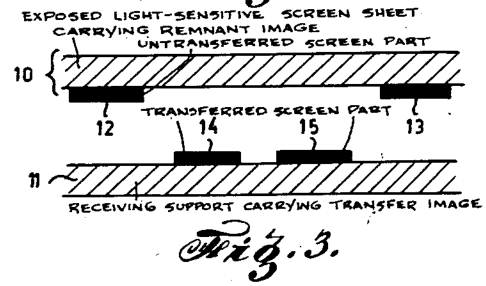

FIG. 3 shows the situation after the transfer operation (i.e. after the separation), 10 being the exposed screen sheet. In the screen sheet 10 the screen parts 12 and 13 which were non-transferable after the imagewise exposure have remained on the sheet. The transferable screen parts 14 and 15 have been transferred to the receiving printing plate 11, which thus has become a "printing plate."

When the transferable screen part matter has insufficient cohesion, the transfer may be incomplete, i.e. on transfer the said transferable matter will only partially transfer to the receiving printing plate. Provided a sufficient quantity has been transferred, however, the printing plate obtained may nevertheless be excellent.

In the light-sensitive screen sheets, light-sensitive matter and screen parts cooperate in such a way that the alteration in the light-sensitive matter caused by the exposure produces a difference in transferability of screen part matter. However, its complete transferability and the useful effect of said alteration are apparently also, to a considerable extent, a matter of its adhesion to the light-pervious support, either direct or by means of an intermediate substance. If this adhesion is too slight, it may occur that, on transfer after imagewise exposure, screen part matter will transfer to the receiving printing plate in all areas, and consequently the transfer is then no longer selective. Analogously, if the adhesion is too great, in certain circumstances no transfer of screen part matter to the receiving printing plate may be realized after imagewise exposure, and in consequence, as in the first case, no image will be formed thereon. Thus, the adhesion of the screen parts to their light-pervious support has to be adjusted to the forces of adhesion between screen parts, light-sensitive matter and the surface of the receiving printing plate coming into operation in the transfer.

In an embodiment of the process according to the invention the light-sensitive matter in the screen sheet contains a lyophilic binder. This use of a lyophilic binder in the light-sensitive matter has, inter alia (see below), the practical advantage of facilitating the transfer operation.

Lyophilic binders which are used for compounding light-sensitive matter are: gelatin, gum arabic, proteins, and fish-glue, although others are also used, e.g. agar-agar, dextrin, gum tragacanth, methyl cellulose, shellac, colophony, synthetic resins, and polyvinyl alcohol (see, inter alia, Eder, Ausführliches Handbuch der Photographie, Vol. IV, 2nd part, pages 22–39, 379; 3rd part, pages 332 and 379; Kolloid-Zeitschrift, Vol. 103, No. 2 (1943), page 167, German Patent No. 684,425).

When using a binder in the light-sensitive matter a layer structure becomes possible. In FIG. 1 the dotted line 2 represents such a layer. The layer structure of the light-sensitive matter promotes sharpness of image, light-sensitivity, and transfer on relatively rough, e.g. grained receiving printing plates. The light-sensitive layer may, for example, have a thickness of 2–4 microns. When the light-sensitive matter has a layer structure, it appears that tearing of the layer takes place during transfer at the borderline between transferable and non-transferable image portions. Generally in the process of this invention and probably due to the use of a transfer liquid, to assist the transfer, this does not appear to affect adversely the formation of a sharp image on the receiving printing plate. As already indicated the screen part matter should follow the tearing process.

The sensitizing compound may be distributed homogeneously throughout the layer of lyophilic binder or may be located in and on the outer surface only of the layer.

Suitable lyophilic binders may be divided into two classes, those which do not dissolve in water at room temperature and those which do. The distinction between non-dissolution and dissolution naturally is not clear-cut. The group of binders first-mentioned includes those which, when added to water (at room temperature), will at best swell within a reasonable length of time, but will not distribute homogeneously throughout the water; an example is gelatin. When a representative of the other group is added to water (at room temperature), it will after some time be homogeneously mixed with the water; an example is gum arabic.

By the use of one or the other kind of binders, different effects are obtained on transfer with the aid of water at room temperature, each of which has its especial advantages. This may be illustrated as follows:

A transfer process is used in which water at room temperature forms the transfer liquid. The light-sensitive substance is of such a nature that on exposure it will decrease the receptivity for water, or solubility in water, of the binder. When working with a light-sensitive layer of a non-dissolving lyophilic binder, the screen parts will be transferred from the less exposed image portions to the receiving printing plate. When working with a light-sensitive layer of lyophilic binder soluble in water at room temperature, treatment with a small quantity of liquid will not dissolve the binder in the unexposed portions, but it will cause the binder to become adhesive there and bring about transfer of screen part matter. The treatment with liquid will not be sufficient for achieving this in the exposed portions, in which the solubility of the layer has decreased. Thus in these portions no transfer will take place.

When in the case last described the transfer is carried out with a greater quantity of liquid, the binder in the less exposed image portions will be removed from the light-sensitive screen sheet by dissolution. Thus in these image portions there is little or no chance of screen part matter being transferred. In the more exposed portions the binder has lost its solubility, but it still has sufficient capacity for absorbing liquid to develop an adhesive effect with the absorbed liquid on transfer. In this way screen part matter may now be transferred from the exposed image portions to the receiving printing plate. Thus a negative printing plate and a positive remnant image are formed, i.e. one and the same light-sensitive layer may bring about opposite results.

As demonstrated above, the process of the invention may be carried out with the aid of light-sensitive screen sheets, the light-sensitive matter of which, on exposure (the same holds for exposure plus after-treatment), alters its adhesive power, at least in wetted condition.

For the practice of the transfer with the aid of water, those light-sensitive screen sheets are of particular utility in the process of the invention in which the light-sensitive matter on exposure (or exposure plus after-treatment) is altered in its water-receptivity.

Light-sensitive screen sheets of which the light-sensitive matter, on exposure (or on exposure plus after-treatment), alters its power to swell with water also find application in the process of the invention. They are advantageous when transferring on to grained receiving printing plates.

The power of swelling with water naturally implies receptivity for water. On the other hand, however, water-receptivity is sometimes found in cases in which the swelling power is only slight. In general it is impracticable to discriminate sharply between receptivity for water, adhesive power on wetting, and swelling power. In practice it will naturally always have to be taken into account that the ambient atmosphere will contain water vapour, so that water will probably always affect the transfer, even in cases in which a water-free liquid is used.

In the foregoing discussion the difference in behaviour of a light-sensitive layer under different transfer conditions has been described, i.e. the behaviour of a light-sensitive layer with a soluble binder for the cases in which little and much liquid is used in the transfer. It has also been explained how one and the same light-sensitive layer can produce opposite transfer and opposite remnant images. In one of the examples which follow a case is described in which, on varying the temperature, the same phenomenon was observed with a layer of light-sensitive matter, containing a non-soluble binder (gelatin). Also in this case the nature of transfer and remnant image could be changed from positive to negative or from negative to positive respectively. Whatever the transfer conditions on the first transfer may, however, have been, and consequently of whatever nature a remnant image may be, it may be transferred to a receiving printing plate in a transfer operation differing from the first.

If, for example, the first transfer has been carried out at room temperature, the remnant image obtained may be transferred at a higher temperature. If in the first transfer the separation has been carried out immediately after the pressing-together, in the second transfer the co-operating surfaces may be left in contact with each other for a somewhat longer time after the pressing-together. In the first transfer the receiving surface may likewise have been a surface having little or no adhesive power, and then the second transfer may be carried out on a receiving printing plate having some adhesive power. Thus for the purposes of the invention it is not essential that the first transfer be carried out on a receiving printing plate; it may just as well take place on another receiving support, for example on a suitable sheet of paper. The first transfer may also be replaced by a washing-out step.

The variants of the invention here described may be used to advantage, for example, when from a negative original a positive printing plate has to be made. The result, however, will always be that the image portions on the printing plate will carry screen part matter from the image-wise exposed screen sheet.

The light-sensitive matter of the screen sheets for the process of the invention is of the kind which, as a result of the photochemical reaction in those image portions which correspond to the light (white) image portions of the original, undergoes an alteration (not occurring or occurring only to a slight extent in the non-exposed or less exposed portions corresponding to the dark portions of the original) which affects the transferability of screen part matter from the screen sheet to the receiving printing plate. As already stated, the light-sensitive matter should be substantially free from light-scattering grains.

In certain cases said transferability is altered by the light reaction in one sense, in other cases in the other sense. In most of the light-sensitive systems here under consideration, the water-receptivity is reduced by exposure. With other light-sensitive systems, which nevertheless are of the same kind, the contrary is the case.

The light-sensitive material, used in the invention, is essentially of the same kind as that which already finds wide application in various photographic and photomechanical processes. This sort of light-sensitive material, as well as processes which can be carried out with it, are described in the literature in many variants.

For instance, reference is made to J. M. Eder: "Ausführliches Handbuch der Photographie," Vol. IV, 2nd part, 1926, wherein on pages 73–77 the so-called pigment paper (carbon tissue) is described, as well as the making of pigment prints (carbon prints) therewith. Sensitized pigment-paper (carbon tissue) also finds wide application in the intaglio-printing technique for the making of an image in a metal- (mostly copper) surface. See Eder: l.c. 3rd part, 4th edition, page 110. Also known are light-sensitive pigment layers on light-pervious supports, see Eder: l.c. 2nd part, pages 212–215. The light-sensitive material in such sensitized pigment papers (carbon tissues) principally consists of bichromated gelatin.

Further in Eder: l.c. 2nd part, pages 245–279 the gum-bichromate printing process is described. The light-sensitive material of sensitized gum-bichromate printing paper principally consists of gum arabic and bichromate.

Light-sensitive material of the said kind is also used in producing relief printing matrixes. See: Eder "Rezepte, Tabellen und Arbeitsvorschriften," 16–17 edition, wherein on page 264 a process is described for producing relief printing matrixes in zinc. As light-sensitive material there is mentioned here a protein and bichromate. Furthermore there is described on page 275 a process for producing half-tone matrixes in copper; in which the light-sensitive material is fish-glue, glucose (grape-sugar) and bichromate.

The above-mentioned light-sensitive materials belong to the kind, in which, by photochemical reactions only, or by a photochemical reaction followed by an after treatment, an alteration (as compared to the situation before exposure) is effected, which involves a reduction of, for instance, the receptivity for water of the material.

Also suitable for use in the invention is light-sensitive material in which, by the photochemical reaction, a reversed alteration (as compared to the situation before exposure) is being effected. Such light-sensitive material mainly consists of a combination of a ferric-compound, tartaric acid and gum arabic as is used in the so-called pigment-dusting-on process as described in Eder, l.c. 4th part, 3rd edition, pages 27 and 28.

Another example of a light-sensitive material applicable to the invention is used in colour photography, see Eder, l.c. 2nd part, page 377.

In addition to the compositions and compounds already mentioned, other substances have also been suggested for compounding light-sensitive matter of the said kind. As examples there may be mentioned: auramin, erythrosin, (tetraiodofluorescein), diazo compounds, and azido compounds. For these, reference is made to Eder, l.c. 2nd part, page 39; Netherlands Patents Nos. 35,423, and 59,407, and German Patent No. 858,195.

In the process according to the invention a light-sensitive screen sheet is preferred which is composed in such a way, that in the unexposed condition of the screen sheet screen part matter is transferable, and that the exposure of the light-sensitive matter causes a decrease of transferability of screen part matter. Such a light-sensitive screen sheet yields positive printing plates from positive originals, without a reversal being necessary. When copying is effected in the manner of screen reflectography, the printing plate will at the same time show a non-laterally reversed image.

In the process of the invention a screen sheet of which the light-sensitive matter contains a lyophilic binder and a chromate will render particularly good service. Preferably the binder is hydrophilic, and the transfer liquid is water. The use of this light-sensitive matter amounts to that of the classical combination of chromate and colloid. Such light-sensitive matter has little stability, but at low temperature it may nevertheless be stored for a reasonable length of time. Chromate-colloid systems of greater stability are known from United States Patent No. 2,526,759.

In an embodiment of the process according to the invention a diazo compound is used to advantage in the light-sensitive matter of the screen sheet. Most of these compounds have good light-sensitivity, and they bring about a steep gradation desirable in the making of printing plates. Diazo layers are of better stability than chromate layers.

As in the Netherlands Patent No. 25,053, when using diazo compounds, the light reaction may be followed by a chemical after-treatment, upon which the physical alteration causing the difference of transferability of screen part matter, then manifests itself.

An example of this is a diazo colloid layer, as described in Netherlands Patent No. 25,053, which after exposure undergoes a treatment with chromate. In the process of the invention such an after-treatment may be combined with the transfer operation, by dissolving the chemical for the after-treatment in the transfer liquid.

Similarly an after-treatment may consist of a treatment with a buffered solution of an azo dyestuff coupling component, which will form an azo dyestuff with the diazo compound left in the imagewise-exposed light-sensitive matter. Then the azo dyestuff may, for example, alter the physical properties of a binder in the light-sensitive matter, and thus cause a difference of transferability, as required for the process according to the invention.

Instead of carrying out said after-treatment, the light-sensitive matter may be composed of a diazo compound and an auxiliary chemical, which may assist in causing a difference of transferability, as required for the process according to the invention. Auxiliary chemicals may, for example, be a chromate or an azo dyestuff coupling component. When the latter is applied, imagewise exposure may be succeeded by a treatment with ammonia fumes to induce coupling.

Because of its cleanliness and simplicity, however, a process is preferred in which there is used a light-sensitive screen sheet of which the light-sensitive matter alters through mere exposure (without interaction with another chemical or without a chemical after-treatment) in such a way that it can cause a difference of transferability of screen part matter as compared with that transferability in the condition before exposure.

Good and reliable results are obtained when in the process according to the invention there is used a light-sensitive screen sheet having in its light-sensitive layer a diazo compound the light decomposition product of which has the property of precipitating proteins (compare Netherlands Patent No. 35,423). Most of the examples will be based on the application of such a diazo compound, which may be used without the aid of any other chemical.

It will be appreciated that the use, in the transfer, of a liquid (mostly water, to which no chemical activity, or at any rate no pronounced chemical activity can be attributed) is not a chemical after-treatment.

The process according to the invention may also be carried out with a light-sensitive screen sheet in the light-sensitive matter of which, besides a lyophilic binder, an azido compound is used (compare, inter alia, Netherlands Patent No. 59,407 and German Patent No. 858,195). For such a screen sheet, a p.p'-diazido-o.o'-disulphonic acid stilbene (compare Netherlands Patent No. 59,407) is particularly suitable.

As already stated, water is preferred as transfer liquid in the process according to the invention. When this is used a screen sheet in which the surface carrying the screen parts is hydrophilic will, on transfer after imagewise exposure, yield a particularly sharp printing plate, which, when it is a planographic printing plate, will show little or no tendency to line-broadening during prolonged planographic printing. The transfer is easily effected. Thus in FIG. 1 the surface 7 of support 3, on which the screen parts 1 rest, may be hydrophilic. Surface 7 may, for example, consist of hydrophilic cellulose ester (completely or partially deacylated). In another embodiment of the process according to the invention, at least one surface of the support of the screen sheet carries a hydrophilic auxiliary layer, and this layer carries the screen parts and, superimposed thereon, light-sensitive matter. When water is used as the transfer liquid, this sheet also yields an excellent printing plate with particular ease and having the merits already described. For the said auxiliary layer, soluble substances, such as polyvinyl alcohol, gum arabic, agar-agar, methyl cellulose, and many others are suitable. Substances which are insoluble at room temperature may also be used; they must not, however, display too great adhesive power on wetting with the transfer liquid. Thus, for example, casein is suitable, and so is slightly hardened or tanned gelatin.

Light-sensitive screen sheets whose screen parts are porous present advantages. An explanation of the utility of porous screen parts may perhaps be as follows:

Amongst the light-sensitive systems which on exposure alter to such an extent that they decrease the transferability of porous screen parts, there are some, which will be active without any binder. Some light-sensitive compounds, such as e.g. certain condensation products of diazo compounds with formaldehyde, are capable of yielding light decomposition products, which are probably capable of polymerizing. These light decomposition products may, probably by blocking the pores, affect the transferability of porous screen parts on (and possibly in) which they have been formed. When the surface of the support with which the screen parts are linked up is hydrophilic, and when water is used as the transfer liquid, it may be supposed that the transfer water cannot reach that surface through the blocked screen parts; consequently it will remain relatively dry underneath these screen parts, and its linkage with the hydrophobic screen parts relatively strong. On the other hand, non-exposed screen parts will remain unblocked, and through these the transfer water can wet the hydrophilic surface and, because the hydrophobic screen parts will have little adhesion to a wetted hydrophilic surface, will weaken its linkage with the screen parts. It is then these latter screen parts which will have sufficient transferability to pass to a receiving printing plate having some adhesive power, whilst the blocked screen parts will remain linked with their original support.

Obviously a blocking process as assumed above may also be achieved with other light-sensitive systems.

In the foregoing, compositions of screen part matter have been mentioned. Porous screen part matter may be composed in essentially the same way, and in many instances, for example, when a hydrophobic binder is used, a mere restriction of the quantity of the binder will cause the screen part matter to become porous. The terms "permeable" and "porous" are used as equivalents (compare United States Patent No. 2,590,857). In view of the face that there are numerous possibilities of compounding porous screen part matter, the examples will, for the sake of simplicity, only illustrate a few of them.

Screen sheets of which the screen pattern is regular are especially advantageous when copying is effected from originals of good quality, from line-drawings, and from printings.

As already said, the fineness of the screen structure is important. This is the case in particular, when the process according to the invention is used for copying and printing, after transfer, images showing half-tone dots.

The formation of moiré effects is largely avoided, and quite good reproduction of dot half-tones is obtained when a screen sheet is used in which the mutual center distance between the light-pervious screen portions or between the screen parts is less than 80 microns and greater than 20 microns. All this naturally depends on the center distance of the half-tone dots in the original to be reproduced, on the quality of the printing ink used, on the evenness of the surface of the printing plate and printing paper, and on other circumstances. The values given above, however, are favourable in many circumstances occurring in practice.

Figure 4:
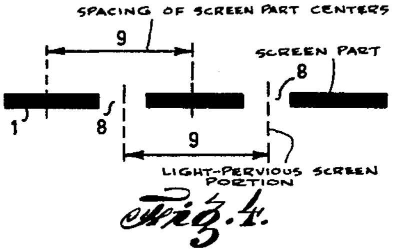
FIG. 4 illustrates the screen structure.

FIG. 4 shows, in diagrammatic cross-section, the location of screen parts 1 side by side with light-pervious screen portions 8. The mutual center distance between the screen parts (= that between the light-pervious screen portions) is indicated by 9.

Figure 5:
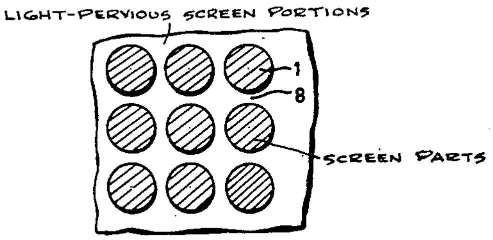
FIGS. 5 and 6 illustrate two ways in which the previous screen portions and the substantially impervious screen parts may be arranged in the screen pattern.
Figure 6:
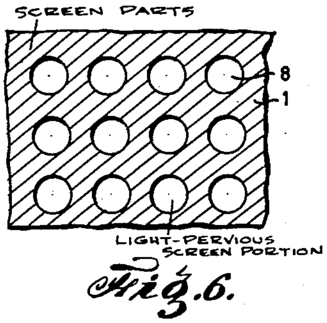

FIG. 5 is a diagrammatic view of a screen pattern in which the screen parts 1 have the form of islands and are encircled by the pervious screen portions 8. It is, however, better to carry out the process according to the invention with a screen sheet in which the light-pervious screen portions have the form of islands. This embodiment is illustrated in FIG. 6, in which the pervious portions 8 have the form of islands, which are encircled by the screen parts 1. Under otherwise comparable conditions, a screen sheet of the pattern of FIG. 6 will need shorter exposure than one of the pattern of FIG. 5. This will be the case in particular when copying from an original on a smooth (paper) surface and when the light passing through the pervious screen portions is diffuse. The screen pattern of FIG. 6 is also favourable as regards the greasy printing ink-receptivity of the hydrophobic screen part layer of the image portions on the printing plate.

Of particular interest for the process according to the invention are screen sheets in which one surface of the light-pervious support has a screen-shaped system of recesses, in which the screen parts are located. After transfer, the screen parts in the upper surface of the image portions on the printing plate will have a measurable thickness and will alternate with open cavities. This is favourable for the printing process in that it inhibits to some extent the spreading of the ink between printing plate and printing paper.

The surface having the recesses may be the surface of any light pervious support; it may be the hydrophilic surface referred to above, or the surface of the above-mentioned hydrophilic auxiliary layer.

Figure 7:
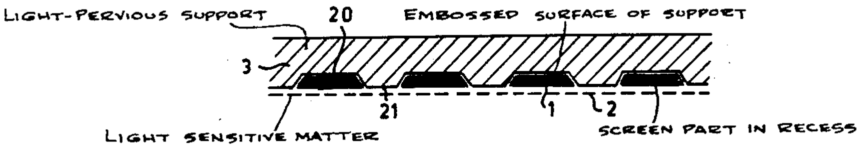
FIG. 7 illustrates the structure of a light-sensitive screen sheet the screen parts of which are located in recesses.

FIG. 7 shows such a screen sheet with light-pervious support 3, in the lower surface of which screenwise distributed recesses 20 have been made by embossing, so that elevations 21 have been formed. The screen parts 1 are located in the recesses. The light-sensitive matter is again denoted by 2. For the use of recesses in light-sensitive screen sheets compare British Patent No. 626,501.

The location of the screen parts in the recesses 20 combines relatively good resistance to damage on manipulation with a transferability, and consequent ease of transfer, greater than is the case with the screen sheets the screen parts of which are not located in recesses. This can probably be accounted for by the lateral pressure exerted on the screen parts during the transfer operation, which lateral pressure cannot laterally shift the screen parts located between the elevations, which for that very reason conduces to loosening the screen parts from the support. More in paritcular in the case of funnel shaped recesses, as shown in FIG. 7, this seems to be a plausible explanation. The screen sheet according to FIG. 7 has the advantage that the screen parts 1 are, as it were, enclosed in the recesses by the overlying layer of light-sensitive matter 2. This layer is preferably linked up with the light-pervious screen portions 21 formed by the elevations of the light-pervious support. In this structure it is advantageous to give the screen parts only little adhesion to the light-pervious support 3 since this facilitates the transfer.

A light-sensitive screen sheet of special interest for the process according to the invention has a light-pervious support which is dimensionally stable against wetting, i.e. the body of the support of the sheet is dimensionally stable against wetting by the liquid used in the transfer. One or both surfaces of the support may nevertheless be hydrophilic. The receiving printing plate (which later becomes printing plate) will practically always be dimensionally stable against wetting, since this is generally an essential requirement for such a printing plate. When the light-sensitive screen sheet is dimensionally stable, the full advantage of true-to-scale printing is obtained. Supports dimensionally stable against wetting are, for example, a glass plate, a sheet of glass cloth, or a sheet of a transparent artificial resin.

In another embodiment of a light-sensitive screen sheet for use in the process according to the invention the light-sensitive matter contains a thermosetting resin. When, as will be described later, the printing plate is heated after transfer, the resin will set and enhance the resistance of the printing plate. Examples of suitable thermosetting resins are the lower polymers of urea-formaldehyde resin, of phenol-formaldehyde resin, of melamine-formaldehyde resin, and the like.

The examples which follow illustrate some of the numerous methods for the manufacture of the light-sensitive screen sheets described above.

When the process according to the invention is used for making printing plates for the production of planographic prints to obtain a large number of copies i.e. for a "long-run" plate, it will usually be necessary to subject the printing plate in the finishing operation to a treatment to improve the resistance of the transferred matter to the planographic printing operations. This in practice requires that the linkage between transferred screen part matter and printing plate should be made stronger than the linkage existing after the mere transfer operation (the previously described ease of retouch is due to the relative weakness thereof), i.e. strong enough to resist the repeated damping and taking up and delivering of printing ink in the planographic printing process. The resistance may thus be improved, for example, by subjecting the printing plate to high pressure. The resistance may, however, also be enhanced by covering the transferred matter with substances resistant to water.

In an embodiment directed to the making of long-run planographic printing plates the printing plate is heated in order to improve said resistance (compare the enhancement of the resistance of a printing plate by heating, described in the British Patent No. 678,599). By the heating operation, the greasy printing ink-receptivity of the transferred image portions may at the same time be improved.

In another embodiment, likewise directed to the making of long-run planographic printing plates the matter transferred to the surface of the printing plate contains a tannable substance, and in order to improve said resistance said substance is tanned. In the case of gelatin, for example, a treatment with formaldehyde, alum, chrom alum, and other known tanning agents is appropriate.

In yet another embodiment, also directed to the making of such long run planographic printing plates, the matter transferred to the surface of the printing plate contains a diazo compound capable of forming hydrophobic azo dyestuffs, and in order to improve said resistance a hydrophobic azo dyestuff is formed from that diazo compound by treatment with a buffered solution of an azo dyestuff coupling component.

In the production of such long run planographic printing plates it is also possible to provide that the matter transferred to the surface of the printing plate contains a diazo compound and an azo dyestuff coupling component, which on being coupled with one another will form a hydrophobic azo dyestuff; in order to improve said resistance, the printing plate is then subjected to a treatment with ammonia fumes.

According to yet another embodiment directed to the making of such long-run planographic printing plates, the matter transferred to the surface of the printing plate contains light-sensitive matter the water-receptivity of which decreases on exposure to light, and in order to improve said resistance the printing plate is exposed. In most cases in which unexposed light-sensitive matter is transferred together with screen part matter, such unexposed light-sensitive matter will automatically fulfil the above-mentioned requirements. When the receiving printing plate is pervious to light, the exposure may be carried out from the rear.

Although not essential in the making of planographic printing plates, it is advisable in the process according to the invention that the transferred screen part matter be made to contrast visually with the surface of the receiving printing plate. This is conducive to the checking and retouching of the printing plate after the transfer operation, preferably before the finishing. In most cases there will automatically be contrast, for in general the receiving printing plate will have a light colour and the screen part matter transferred will be dark. Also, however, the light-sensitive matter may be pigmented, and in this latter case the pigment used must not form a serious obstruction in the exposure.

The pigment may also be formed after the transfer operation. When, for example, the transferred screen part matter and/or the light-sensitive matter contain a diazo compound, an azo dyestuff may be formed therein.

The imagewise exposure of the light-sensitive screen sheet may be effected optically on the light-sensitive side. In many cases, however, a contact-copying method will be preferred. In contact-copying the light-sensitive screen sheet will be exposed in the manner of FIG. 1, with the light incident in the direction of arrow 6'. The process of the invention is, however, mainly designed for carrying out the screen reflex process as illustrated by FIG. 1, with exposure in the direction of arrow 6.

Figure 8:
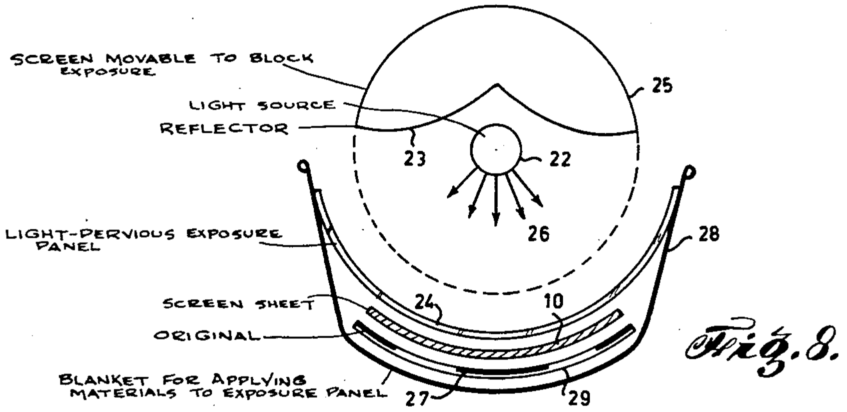
FIG. 8 illustrates imagewise exposure.

FIG. 8 is a diagrammatic cross-section of a copying apparatus, in which 22 is a high-pressure mercury vapour lamp having, for example, a length of 42 cm. and a power of 700 watts, 23 an aluminium reflector, and 24 a segment of a glass cylinder with an outside diameter of 19 cm. By means of shade 25, rotatable about its axis through the path indicated by a dotted line, the surface to be exposed can be shaded from the light beams 26. The screen sheet 10 to be exposed in the manner of screen reflectography together with the original 29, with image portions 27, is pressed by means of the blanket 28 against the outside of the glass cylinder in order to achieve the required contact between light-sensitive screen sheet and original, and with opened shade 25 is irradiated from lamp 22 through cylinder 24. The apparatus may likewise be used for the finishing by exposure of flexible printing plates as described above.

In the process of the invention originals without continuous tones are preferably started from.

Preferably, according to the invention, the original from which the printing plate is to be made should not contain areas of continuous tone.

The pressing-together necessary for transfer is preferably carried out by laying the two cooperating sheets (exposed screen sheet and receiving printing plate) in super-position with the transfer liquid between them, and then pressing them together by means of at least one pressing roller. In this way difficulties such as the occlusion of air bubbles, which may occur in other pressing methods are avoided.

Figure 9:
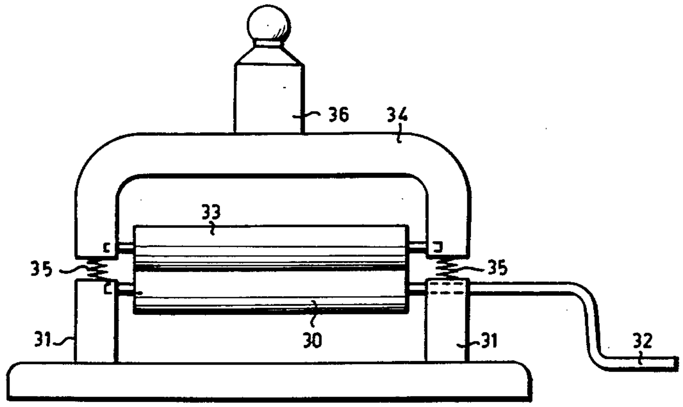
FIG. 9 illustrates an apparatus for pressing together the exposed screen sheet and receiving printing plate in the transfer operation.

FIG. 9 diagrammatically represents a simple apparatus suitable for such pressing-together of an exposed screen sheet and a receiving printing plate. Rubber roller 30 is mounted in the bearings 31 on the base, and is driven by means of crank 32. The rubber roller 33 is mounted on both sides in frame 34, which is supported on its sides (not shown). The springs 35 neutralize the weight of roller 33 and frame 34. On top of frame 34 a weight 36 is placed, which weight will determine the pressure of roller 33 on roller 30. The rubber rollers have, for example, a length of 280 millimetres, a diameter of 40 millimetres, and a hardness of 75 Shore. Although in general the transfer is carried out at room temperature, in certain cases application of heat in the transfer may be useful. Preferably this heat will be applied to the rollers by means of which the transfer surfaces are pressed together. In certain circumstances this results in better transfer, and at the same time it has the advantage that part of the transfer liquid is eliminated by evaporation.

Figure 10:
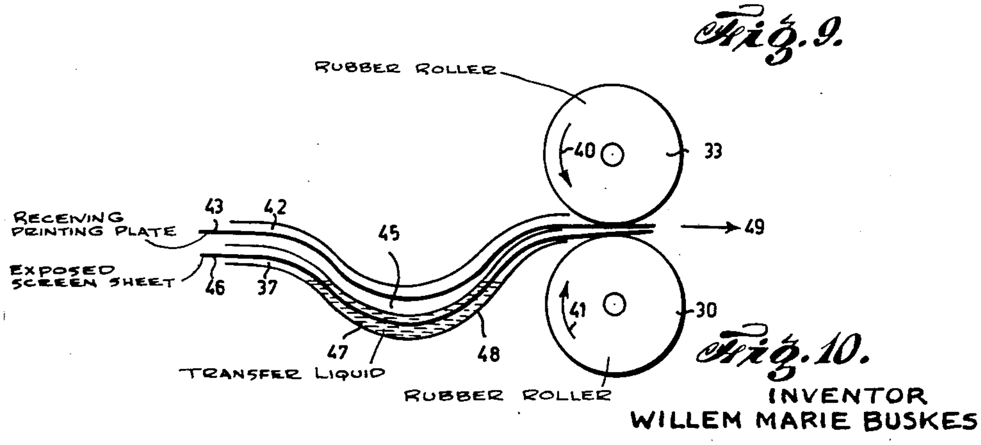
FIG. 10 illustrates a transfer apparatus for combined wetting and pressing-together.

FIG. 10 is a diagrammatic cross-section of a transfer apparatus for the combined wetting and pressing-together previously described. Two pressing rollers are indicated by 30 and 33; they rotate in the directions of arrows 40 and 41. The pressing rollers 30 and 33 have, for example, a diameter of 40 mm., a length of 280 millimetres and a hardness of 75 Shore. The pressure between them can be adjusted to the requirements of a given transfer operation carried out with a given exposed screen sheet and a given receiving printing plate. Exposed screen sheet 46 is inserted via slot 37 and is conveyed through the liquid 47, which is contained in trough 48, to reach the pressing zone between rollers 30 and 33. Its imagewise exposed surface is turned upward. Measured along the travelling path of the sheet, the distance between the place where it is immersed and the pressing zone is 10 cm. The receiving printing plate 43 is inserted into the apparatus via slot 42 with its receiving surface downward, and is conveyed through slot 45, not filled with liquid. The two sheets meet in the pressing zone, are joined there, leave the apparatus in the direction of arrow 49, and may be separated by hand.

When it is desirable to wet the receiving surface instead of the exposed screen sheet, the situation remains as indicated in FIG. 10 with the difference, however, that now 46 denotes the receiving printing plate, with the receiving surface turned up, and 43 the exposed screen sheet with the exposed side down.

The slot 45 may also be filled with liquid (the same liquid as in trough 48 or a different liquid) so that both sheets are wetted.

The separation of the exposed screen sheet from the printing plate will generally be effected shortly after they have been pressed together.

In carrying out the process according to the invention an auxiliary adhesive is generally not necessary, but in some cases it may nevertheless be of use, e.g. for obtaining an improved linkage between the transferred screen part matter and the surface of the receiving printing plate. Thus the transfer liquid may contain a suitable adhesive or the transfer may be carried out on a receiving printing plate of which the receiving surface has been treated in such a way that it will develop adhesive properties at least during the transfer process. It appears that the (selective) transfer is based on a balancing of adhesive forces. This must be taken into consideration when adhesives are used in the transfer liquid or on the surface of the receiving printing plate; in fact, excessive adhesion to the receiving surface may cause both screen part matter of greater transferability and also screen part matter which is less transferable to be transferred from the imagewise exposed screen sheet and in this case no printing plate is obtained.

Suitable adhesives are, for example, for use in the transfer liquid: gum arabic in water, polyvinyl alcohol in water or in a mixture of water and alcohol, dextrin and fish glue in water; for use on the surface of the receiving printing plate: gelatin, polyvinyl alcohol, casein and various artificial resin emulsions.

As already stated, most of the examples are based on the use of a single diazo compound. This is the condensation product of p-diazo-diphenylamine and formaldehyde, prepared according to Example I of the Netherlands Patent No. 35,480. In the examples this diazo compound, for the sake of brevity, will each time be referred to as "diazo aldehyde." The examples serve to illustrate various embodiments of the invention, and owing to the use each time of the same diazo compound, the respective results of the examples are comparable with one another. However, other compositions of the light-sensitive matter are used in some examples.

Likewise, for the sake of brevity, the terms "cellulose acetate sheet" and "gelatin" are used without any further indication. By "cellulose acetate" sheet is then to be understood a sheet having an acetyl content corresponding to about 50% by weight of combined acetic acid (the same consideration applies to a cellulose acetate layer); if not otherwise indicated the sheet will have a weight of 80 g. per sq. metre. By "gelatin" without any further indication there is to be understood the Super Photo JO–5 type, manufactured by Gélatines, Hasselt and Vilvorde. This acetate sheet and this gelatin are merely examples of numerous suitable qualities. In the examples only one quality of each is used, in order to make the results more readily comparable with one another.

In composing the screen part matter, carbon black was generally chosen from the gerat number of suitable pigments, because with this the high density of the screen parts necessary for screen reflectography can be achieved with the greatest ease and certainty. From the numerous suitable binders for screen part matter, cellulose acetate butyrate and/or asphalt were generally chosen.

The "carbon black" and "asphalt" employed in the examples were always carbon black of the Kosmos–20 type of United Carbon Company Inc., Charleston W. Va., U.S.A. and asphalt of the Ennjay, Oxidized Asphalt 285/300 M.P. type of Standard Oil Company, Baltimore, Maryland, U.S.A. By the term "transparent paper" used in the examples is meant each time "transparent paper" No. S–1582 Super Transparent of Wiggins tape of 90 g. per sq. metre.

Likewise for the sake of brevity and for better comparison, the examples merely refer to: "deacylation" of cellulose acetate surfaces without any further indications. This deacylation was carried out as follows:

The cellulose acetate sheet was immersed for 1 sec. and at a temperature of 28° C. in a solution of:

600 cc. ethyl alcohol
50 cc. water
43 g. potassium hydroxide.

The sheet was subsequently dried so as to be dry after exactly 20 seconds; thereupon it was immersed for 1.5 sec., this time at a temperature of 27° C., in the following liquid:

600 cc. ethyl alcohol
300 cc. water
72 g. potassium hydroxide and it was then dried so as to be dry after exactly 10 sec. It was subsequently washed in running water for 30 sec., and immediately afterwards immersed for 7.5 sec. at room temperature in a solution of the following composition:

600 cc. ethyl alcohol
3150 cc. water
75 g. oxalid acid.

The sheet was then dried so as to be dry after exactly 12 sec.

This is one of the many suitable methods for deacylation, and it is referred to as "deacylation" in the examples.

As already stated, the exposure may be effected in different ways. When not otherwise indicated, the examples are based on copying in the manner of screen reflectography in the apparatus of FIG. 8. A page of good printed matter serves as the original.

In many examples the receiving printing plate will be referred to as "finely grained aluminium printing plate" for which in those examples an aluminium sheet, commercially known as "Rotaprint E–RKL 2 Sorte," was used. It is one of the many suitable planographic metal sheets. In other examples a receiving printing plate made of paper was used, commercially known as "Rotamasta Blue" and obtainable from Kaye's Rotaprint Agency Ltd., Rotaprint House, Honeypotlane, London NW. 9. It is one of the many suitable planographic papers, and in the examples it is referred to as "paper receiving printing plate."

The wetting operations in the examples, for whatever purpose, when not otherwise indicated, are carried out with water.

In the examples the apparatus of FIG. 9 or that of FIG. 10 is used for the pressing-together. The travelling speed through either of these apparatuses is referred to as "transfer speed" (in metres per minute). The "transfer pressure" is indicated in kg. per lineal cm. of the pressing rollers.

In the examples the mutual center distance of the light impervious screen portions will be referred to as "center distance 9" (compare FIG. 4). The ratio of the aggregate surface area of the light-pervious screen portions to the total surface area of the screen will be referred to as "light transmission." This will be defined as a percentage.

Where in the examples a screen sheet according to FIGS. 6 and 7 is referred to, there is meant a light-sensitive screen sheet of which the support 3, showing the relief, consists of cellulose acetate.

The screen relief is obtained by making the surface mouldable, e.g. by heating or wetting with a solvent such as acetone. Thereupon the relief of FIGS. 6 and 7 is embossed. In the examples referred to above the "height" of the elevations is approximately 10 microns. It may, however, also be lower or higher but it is found that in practice a "height" less than 5 microns or greater than 15 microns is not very desirable.

When the relief surface is deacylated, the relief should not be altered essentially by that operation.

The screen parts 1 (FIG. 7) are formed in the recesses 20 by filling them with a finely ground pigment suspension. After drying, the elevations 21 may be cleaned with soft smooth leather.

The support of the sheet need not consist of cellulose acetate throughout (as referred to above) but may also consist (for the sake of simplicity this is not shown) of a transparent support, such as transparent paper, cellulose hydrate, polyvinyl acetate or even glass, carrying a cellulose acetate layer. The relief is then made in this layer.

When in the examples offset prints are made, wherever not otherwise indicated, this is done by means of the "Rotaprint RKL Office Offset printer," equipped with automatic damping installation. The finished printing plate is mounted in this offset machine, the image side of the plate is washed with a wet sponge, damped and inked a few times, and then prints are made.

The printing ink used in the examples is always Rotaprint printing ink, Black, RF 991 type, obtainable from the firm of Blikman & Sartorius, Amsterdam.

It is obvious that the use of one single type of the materials and the application each time of one single method in the examples is not to be understood as a limitation on the scope of the invention in any respect whatsoever.

*Example I*

A cellulose acetate sheet of 500 g./sq. metre is superficially wetted with acetone, thus made mouldable and pressed against a hardened gelatin screen matrix, consisting of crossed channels encircling screen cupolas. After having been removed from the matrix, the surface of the cellulose acetate sheet has an intaglio relief of a structure as used in intaglio printing. Center distance 9: 80 microns. Depth of the screen cells: approximately 12 microns.

The intaglio relief surface is deacylated and mounted about a metal cylinder, with said surface outwards. The intaglio relief of the cylinder is covered with a layer of a finely ground pigment suspension of the following composition:

250 g. carbon black
50 g. asphalt
1000 cc. xylene.

It is then dried, and the elevations of the relief are cleaned with a rotating flannel disc. The dry black pigment matter is only left behind on the cylinder in the screen cells. A sheet of transparent paper, provided with a layer of gelatin of approximately 3 g./sq. metre, is wetted and immediately pressed against the cylinder with its wet gelatin side. With its adhesive gelatin side it takes over the dry pigment matter from the cells of the screen relief.

When leaving the cylinder, the transparent paper carries a screen consisting of screen parts, which contain hydrophobic matter, are porous to water and impervious to light. Light transmission of the screen: 10%. A composition of:

9 g. gelatin in
100 cc. water is cast at 40° C. on the screen side of the screened transparent paper so as to form a layer, and after drying it is sensitized by impregnation with:

3 g. diazo aldehyde in
100 cc. water and dried again. The layer weighs approximately 2.5 g./sq. metre. It is water-receptive, swellable with water, and becomes adhesive on wetting with water. The light-sensitive screen sheet obtained has a structure according to FIGS. 1 and 5. Exposure: 90 sec. Receiving printing plate: finely grained aluminium printing plate. Transfer operation: the exposed screen sheet is immersed for a few seconds and then pressed together with the receiving printing plate. Transfer speed: 1 m. Transfer pressure: 2 kg. Separation: shortly after pressing-together. The planographic printing plate formed is positive. If necessary it is retouched. Finishing: the printing plate is kept for 10 min. at 150° C. and cooled.

With the finished printing plate, positive offset prints are obtained.

*Example II*

A cylinder with screen relief according to Example I is used; the relief, however, has the form of crossed channels encircling elevations. Center distance 9: 60 microns. Depth of the channels: 8 microns. In the screen relief, screen parts are formed in the manner of Example I. Composition of the pigment suspension:

15 g. cellulose acetate butyrate of the AB/500/1 type of Tennessee Eastman Corp., Kingsport, Tennessee, U.S.A. (this is one of the many suitable binders for the pigment matter, and it will be referred to in the following examples as "cellulose acetate butyrate")
120 g. carbon black
1000 cc. ethyl acetate.

A cellulose acetate sheet, provided with a layer of gum arabic and wetted on its gummed side at 20° C. with a mixture consisting of equal parts by volume of ethyl alcohol and water, takes over the screen parts as described in Example I. Light transmission: 6%. The screen side of the sheet is provided with a gelatin layer of 2.5–3 g./sq. metre, and this layer is superficially impregnated with:

4 g. diazo aldehyde in
100 cc. water and then dried. Exposure: 60 sec. Receiving printing plate: finely grained aluminium printing plate. Transfer operation: in the apparatus according to FIG. 10; the receiving printing plate is wetted. Transfer speed: 2 m. Transfer pressure: 2 kg. Separation: shortly after pressing-together. The planographic printing plate formed is positive. If necessary, it is retouched. Finishing: it is kept for 10 min. at 130° C., cooled and the image side of the printing plate is treated for 1 min. with:

150 g. gum arabic
900 cc. water
27 cc. phosphoric acid (s.g. 1.3)
0.5 g. carbolic acid.

In the following examples this solution will be referred to as "fixing solution."

With the finished printing plate, positive offset prints are obtained.

*Example III*

Screen sheet according to FIGS. 6 and 7. Center distance 9: 90 microns. Light transmission: 10%. The relief surface was not deacylated. Diameter of the elevations 21 (FIG. 7): 32 microns; they have the form of cones; their diameter at the base is greater than 32 microns. Composition of the pigment suspension:

100 g. diazo aldehyde
300 g. gum arabic
100 g. carbon black
1000 cc. water
90 cc. ethyl alcohol
2 cc. glycerol.

The screen parts are porous to water and become adhesive on their accessible side upon wetting. Besides throughout their body light-sensitive matter is present on the side which is remote from the support. Exposure: 80 sec. Receiving printing plate: paper receiving printing plate. Transfer operation: in the apparatus according to FIG. 10; the receiving printing plate is wetted. Transfer speed: 3 m. Transfer pressure: 2.5 kg. Separation: shortly after pressing-together. The planographic printing plate formed is positive. If necessary, it is retouched. Finishing: the printing plate is exposed for 180 sec., treated for 1 min. with fixing solution, and dried.

With the finished printing plate, positive offset prints are obtained.

Instead of using a cellulose acetate sheet as support, one may use other transparent sheets in which a relief may be formed, such as sheets of polyvinyl acetate, or cellulose nitrate.

*Example IV*

Screen sheet according to FIGS. 6 and 7. Center distance 9: 100 microns. Light transmission: 7.5%. The relief surface was coated with a solution of gum arabic, which after drying left a hydrophilic auxiliary layer of approximately 1–2 g./sq. metre on the relief. The structure of the relief in the upper surface of the auxiliary layer was essentially the same as that of the original relief surface. Composition of the pigment suspension:

150 g. carbon black
24 g. asphalt
1000 cc. xylene.

The screen parts are hydrophobic and porous to water. The light-sensitive layer was formed by casting:

80 g. gelatin
15 g. diazo aldehyde
1000 cc. water and drying. The layer weighs 3.5 g./sq. metre. It is water-receptive, swellable with water, and becomes adhesive on wetting with water. Exposure: 90 sec. Receiving printing plate: finely grained aluminium printing plate. Transfer operation: the receiving printing plate is wetted on its grained side, and subsequently pressed together with the imagewise exposed screen sheet. Transfer speed: 2 m. Transfer pressure: 3 kg. Separation: shortly after pressing-together. The planographic printing plate formed is positive. If necessary, it is retouched.

Finishing: the printing plate is kept at 150° C. for 10 min. and cooled.

With the finished printing plate, positive offset prints are obtained.

*Example V.a*

Screen sheet according to FIGS. 6 and 7. Center distance 9: 40 microns. Light transmission: 6%. The relief surface was deacylated. Composition of the pigment suspension:

120 g. carbon black
15 g. cellulose acetate butyrate
1000 cc. ethyl acetate.

The screen parts are hydrophobic and porous to water. The light-sensitive layer was formed by casting:

80 g. gelatin
20 g. diazo aldehyde
20 g. magnesium sulphate
1000 cc. water and drying. The layer weighs 3 g./sq. metre. It is water-receptive, swellable with water, and becomes adhesive on wetting with water. It has close contact with the deacylated tops of the relief. Exposure: 80 sec. Receiving printing plate: paper receiving printing plate. Transfer operation: in the apparatus according to FIG. 10. Transfer liquid: a 2% by weight solution of gum arabic in water. The imagewise exposed screen sheet is wetted. Transfer speed: 1.3 m. Transfer pressure: 1.25 kg. Separation: shortly after pressing-together. The planographic printing plate formed is positive. If necessary, it is retouched. Finishing: the printing plate is exposed for 2 min.

With the finished printing plate, positive offset prints are obtained.

If the transfer operation is carried out with water at 45° C., a negative printing plate and negative offset prints are obtained. With this processing method, positive offset prints are obtained when starting from a negative original. When copying according to FIG. 1, arrow 6', under a tracing with dense black lines, the exposure is 20 sec. and in the transfer operation a transfer speed of 2 m. and a transfer pressure of 2.8 kg. are used. The planographic printing plate formed is positive. With the finished printing plate, positive offset prints are obtained.

If in the manufacture of the light-sensitive screen sheet the pigment suspension is:

1 part by volume of "dag" colloidal graphite in naphtha, product 450, obtainable from Acheson, Colloids Ltd., 9 Gayfere Street, London, S.W. 1, England
1 part by volume of ethyl acetate, a printing plate is obtained in the following way: Exposure: 150 sec. Receiving printing plate: finely grained aluminium printing plate. Transfer operation: in the apparatus according to FIG. 10; the imagewise exposed screen sheet is wetted. Transfer speed: 2.5 m. Transfer pressure: 2.7 kg. Separation: shortly after pressing-together. The planographic printing plate formed is positive. If necessary, it is retouched. Finishing: the printing plate is kept for 5 min. at 140° C., cooled, treated with fixing solution, and dried. With the finished printing late, positive offset prints are obtained.

If in the manufacture of the light-sensitive screen sheet the pigment suspension is:

180 g. iron oxide (English red)
20 g. cellulose acetate butyrate
1000 cc. ethyl acetate a printing plate is obtained in the following way: Exposure: 240 sec. Receiving printing plate: finely grained aluminium printing plate. Transfer operation: in the apparatus according to FIG. 10; the receiving printing plate is wetted. Transfer speed: 2 m. Transfer pressure: 15 kg. Separation: 2 min. after pressing-together. The planographic printing plate formed is positive. If necessary, it is retouched. Finishing: the printing plate is kept for 5 min. at 150° C., cooled, wetted, inked, treated with fixing solution, and dried.

With the printing plate thus finished, positive offset prints are obtained.

*Example V.b*

Screen sheet according to FIGS. 6 and 7. Center distance 9: 40 microns. Light transmission: 6%. The relief surface was deacylated. Composition of the pigment suspension:

120 g. carbon black
15 g. cellulose acetate butyrate
1000 cc. ethyl acetate

The screen parts are hydrophobic and porous to water. The light-sensitive layer was formed by casting:

80 g. gelatin
20 g. diazo aldehyde
20 g. magnesium sulphate
1000 cc. water and drying. The layer weighs 3 g./sq. metre. It is water-receptive, swellable with water, and becomes adhesive on wetting with water. It has close contact with the deacylated tops of the relief. Exposure: 80 sec. Receiving printing plate: at choice finely grained aluminium or zinc printing plate. Transfer operation: in the apparatus according to FIG. 10; the imagewise exposed screen sheet is wetted. Transfer speed: 1.3 m. Transfer pressure: 1.25 kg. Separation: shortly after pressing-together.

The planographic printing plate formed is positive. If necessary, it is retouched.

Finishing: the printing plate is kept for 5 min. at 150° C., cooled, treated for 1 min. with fixing solution, and dried. Alternative finishing method: the printing plate is immersed for 30 sec. in:

20 g. sodium carbonate
15 g. pyrogallol
1000 cc. water, rinsed, dried, and treated for 30 sec. with fixing solution. Alternative finishing method: the printing plate is placed for 20 min. in concentrated formalin vapour and then treated with fixing solution.

Alternative finishing method: the printing plate is immersed for 30 sec. in:

15 g. 2,3-dihydroxy naphthalene
100 g. sodium carbonate
1000 cc. water.

A hydrophobic azo dyestuff is formed in the transfer image. After drying, the printing plate is treated with fixing solution and dried again.

With the finished printing plate, sharp positive offset prints are obtained.

Before the finishing operation the planographic printing plate may be reversed as follows:

The printing plate is evenly coated with:

100 g. asphalt
1000 cc. xylene and dried. The asphalt layer and transferred matter are removed from the transferred image portions by sponging with water at 35° C. The other portions remain covered with asphalt. After rinsing with cold water and inking, negative offset prints are obtained with the printing plate thus finished.

When exposure is effected under a tracing, according to FIG. 1, arrow 6', so as to form a non-laterally reversed image in the sensitive matter 2, and when a lithographic stone is used as receiving printing plate, on which, after wetting, the imagewise exposed screen sheet is pressed by means of a roller, a positive transfer image is obtained on the stone. If necessary, the stone is retouched. Finishing: the stone is kept for 10 min. at 150° C., cooled, treated with fixing solution, and inked. From the stone ordinary planographic prints are made. When as receiving printing plate a superficially deacylated transparent cellulose acetate sheet is used, the imagewise exposed screen sheet and the deacylated cellulose acetate sheet are both wetted and pressed together in order to effect the transfer.

Finishing: the cellulose acetate printing plate is exposed for 30 sec. with its image side turned away from the light source. With the finished sheet, positive offset prints are obtained.

The superficially deacylated cellulose acetate receiving printing plate may be mounted on a metal sheet, e.g. an aluminium sheet. The transfer operation remains unchanged. During the finishing operation the image side is directly exposed. The light is transmitted through the light-pervious screen portions and is diffusely reflected by the metal surface. It thus reaches the light-sensitive matter underneath the screen parts. Exposure in this case: 90 sec. With the finished sheet; positive offset prints are obtained.

The transfer may be carried out on a smooth aluminium printing plate. For finishing, it is kept for 5 min. at 150° C., and after cooling, exposed to sandblasting with fine sand. The transfer image remains intact; the uncovered portions of the plate are finely grained. With the finished printing plate, positive offset prints are obtained.

When the screen sheet is used for making a reflex copy from an original with half-tone dots, having 625 individual dots per sq. cm., exposure is carried out for 60 sec., and transfer is effected on a cleaned copper receiving printing plate with a smooth surface.

Transfer operation: the imagewise exposed screen sheet is immersed for 5 sec. and then pressed together with the copper receiving printing plate. Transfer speed: 2.5 m. Transfer pressure: 1 kg. Separation: shortly after pressing-together. The planographic printing plate formed is positive. If necessary, it is retouched. Finishing: the printing plate is kept for 10 min. at 150° C., cooled and then etched for 20 min. with ferric chloride solution (40° Bé.) (the transferred matter serves as a "resist"). After having been thoroughly washed in running water and dried, the dot relief printing plate obtained is inked on the tops of its dots. Positive prints are made in the manner of reliefprinting on art paper. The prints obtained show a laterally reversed image of the original. In another embodiment the copy is made from a pen-drawing in thin lines on white paper, in the manner of screen reflectography, with the aid of the screen sheet.

Exposure: 60 sec. The transfer is carried out on a sheet of art paper in the apparatus of FIG. 10. The imagewise exposed screen sheet is wetted. Transfer speed: 2.5 m. Transfer pressure: 1.7 kg. Separation: shortly after pressing-together.

A negative remnant image is left in the screen sheet. After drying, this is pressed against the wet surface of a cleaned, smoothly polished copper receiving printing plate. Transfer speed: 1.7 m. Transfer pressure: 2 kg. Separation: 1 min. after pressing-together. The printing plate formed is negative. If necessary, it is retouched. Finishing: the printing plate is kept for 10 min. at a temperature of 150° C., cooled and etched for 30 min. with the ferric chloride solution referred to above. After having been thoroughly washed with water and dried, the intaglio relief obtained is inked, and positive laterally reversed intaglio prints are made.

*Example VI*

Screen sheet according to FIGS. 6 and 7. Center distance 9: 40 microns. Light transmission: 6%. The relief surface was deacylated. Composition of the pigment suspension:

120 g. carbon black
15 g. cellulose acetate butyrate
1000 cc. ethyl acetate

The screen parts are hydrophobic and porous to water. The light-sensitive layer was formed by casting:

80 g. gelatin
15 g. diazo aldehyde
15 g. p-benzoylamido-2,5-diethoxy benzene diazonium chloride zinc chloride double salt 2.5 g. beta-hydroxy ethylamide of beta-hydroxy naphthoic acid
1000 cc. water.

and drying. The layer weighs 3.2 g./sq. metre. It is water-receptive, swellable with water, and becomes adhesive on wetting with water. It has close contact with the deacylated tops of the relief. Exposure: 60 sec. Receiving printing plate: finely grained aluminium printing plate. Transfer operation: in the apparatus according to FIG. 10; the image-wise exposed screen sheet is wetted. Transfer speed: 2 m. Transfer pressure: 1.8 kg. Separation: shortly after pressing-together. The planographic printing plate formed is positive. If necessary, it is retouched.

Finishing: the printing plate is kept for 2 min. in concentrated ammonia vapour; a hydrophobic azo dyestuff is formed in the transfer image. The printing plate is treated with fixing solution and dried. With the finished printing plate, positive offset prints are obtained.

*Example VII*

Screen sheet according to FIGS. 6 and 7. Center distance 9: 40 microns. Light transmission: 6%. The relief surface was deacylated. Composition of the pigment suspension:

120 g. carbon black
12 g. asphalt
500 cc. of a 10% by weight solution of cellulose acetate butyrate in ethyl acetate
500 cc. xylene The screen parts are hydrophobic. The light-sensitive layer was formed by casting:

60 g. gelatin
20 g. diazo aldehyde
1000 cc. water.

and drying. The layer weighs 3.5 g./sq. metre. It is water-receptive, swellable with water, and becomes adhesive on wetting with water. It has close contact with the deacylated tops of the relief. The light-sensitive screen sheet is made dimensionally stable against wetting with water in the following way: its back surface is coated with the co-polymer emulsion of butyl acrylate and vinyl acetate—Acronal 500 D, obtainable from the Badische Anilin und Soda Fabrik, Ludwigshafen, Germany—and dried. An adhesive layer is formed. A colourless transparent Vinylite sheet of a thickness of 0.25 mm.—obtainable from Carbide & Carbon Chem. Corp., New York, U.S.A.—is made adhesive in the same way. The two sheets are pressed together under high pressure at 50° C. with their adhesive sides turned towards each other, and unites to one sheet.

Exposure: 90 sec. Receiving printing plate: finely grained aluminium printing plate. Transfer operation: the imagewise exposed screen sheet is wetted for 20 sec., and then pressed together with the receiving printing plate.

Transfer speed: 1.25 m. Transfer pressure: 2.5 kg. Separation: shortly after pressing-together. The planographic printing plate formed is positive. If necessary, it is retouched. Finishing: the printing plate is kept for 5 min. at 130° C., cooled, treated with fixing solution, and dried.

With the finished printing plate, positive offset prints are obtained, the dimensions of which do not differ substantially from those of the original.

*Example VIII*

Screen sheet according to FIGS. 6 and 7. Center distance 9: 70 microns. Light transmission: 10%. The relief surface was deacylated. Composition of the pigment suspension:

200 g. carbon black
50 g. asphalt
1000 cc. xylene

The screen parts are hydrophobic and porous to water. The light-sensitive layer was formed by casting:

80 g. gelatin in
1000 cc. water and, after drying, impregnating the gelatin layer thus obtained with:

20 g. ammonium bichromate in
1000 cc. water and drying again. The layer is water-receptive, swellable with water, and becomes adhesive on wetting with water. It has close contact with the deacylated tops of the relief.

Exposure: 150 sec. Receiving printing plate: finely grained aluminium printing plate. Transfer operation: in the apparatus according to FIG. 10; the imagewise exposed screen sheet is wetted. Transfer speed: 1.5 m. Transfer pressure: 2 kg. Separation: shortly after pressing-together. The planographic printing plate formed is positive. If necessary, it is retouched. Finishing: the printing plate is kept for 5 min. at 150° C., and after cooling is treated for 1 min. with fixing solution.

With the finished printing plate, positive offset prints are obtained.

Instead of a finely grained aluminium printing plate, a finely grained zinc printing plate may be used. The finising operation is the same.

*Example IX*

Screen sheet according to FIGS. 6 and 7. Center distance 9: 80 microns. Light transmission: 12%. The relief surface was deacylated. Composition of the pigment suspension:

32 g. asphalt
200 g. carbon black
400 cc. of a solution of 3% by weight of cellulose acetate butyrate in ethyl acetate
48 cc. propylene glycol
1000 cc. xylene.

The screen parts are hydrophobic and porous to water. The light-sensitive layer was formed by casting:

90 g. gelatin and
15 g. sodium salt of 4.4′-diazido-stilbene 2-2′-disulphonic acid in
1000 cc. water and drying. The layer weighs 3 g./sq. metre. It is water-receptive, swellable with water, and becomes adhesive on wetting with water. It has close contact with the deacylated tops of the relief. Exposure: 150 sec. Receiving printing plate: finely grained aluminum printing plate. Transfer operation: in the apparatus according to FIG. 10; the imagewise exposed screen sheet is wetted. Transfer speed: 1.5 m. Transfer pressure: 2 kg. Separation: shortly after pressing-together. The planographic printing plate formed is positive. If necessary, it is retouched.

Finishing: the printing plate is kept for 5 min. at 150° C., cooled and its image side is treated with fixing solution for 1 min.

With the finished printing plate, positive offset prints are obtained.

*Example X*

Screen sheet according to FIGS. 6 and 7. Center distance 9: 65 microns. Light transmission: 15%. The relief surface was deacylated. Composition of the pigment suspension:

120 g. carbon black
15 g. cellulose acetate butyrate
1000 cc. ethyl acetate.

The screen parts are hydrophobic and porous to water. The light-sensitive layer was formed by casting:

80 g. gelatin in
1000 cc. water and, after drying, impregnating the gelatin layer thus obtained with:

40 g. p-N-ethyl-N-beta-hydroxy-ethylamino benzene diazonium chloride zinc chloride double salt in
1000 cc. water and drying again. The layer weighs 4 g./sq. metre. It is water-receptive, swellable with water, and becomes adhesive on wetting with water. It has close contact with the deacylated tops of the relief.

Exposure: 130 sec. Receiving printing plate: paper receiving printing plate. Transfer operation: in the apparatus of FIG. 10; the imagewise exposed screen sheet is wetted. Transfer speed: 1.3 m. Transfer pressure: 1.5 kg. Separation: shortly after pressing-together. The planographic printing plate formed is positive. If necessary, it is retouched. Finishing: the paper printing plate is kept for 3 min. at 145° C., and after cooling its image side is treated with fixing solution for 1 min.

With the finished printing plate, positive offset prints are obtained.

Analogous results are obtained, by substituting in the sensitizing solution, the 40 g. of the diazo compound used therein, by 36 g. of p-ethylaminobenzene diazonium chloride zinc chloride double salt or by 30 g. p-N-ethyl-N-beta-diethylamino ethylamino benzene diazonium chloride zinc chloride double salt.

*Example XI*

Screen sheet according to FIGS. 6 and 7. Center distance 9: 70 microns. Light transmission: 6%. The relief surface was deacylated. Composition of the pigment suspension:

200 g. carbon black
50 g. asphalt
1000 cc. xylene.

The screen parts are hydrophobic and porous to water. The light-sensitive layer was formed by casting:

250 g. dextrin and
10 g. diazo aldehyde in
1000 cc. water and drying. The layer weighs 2.5 g./sq. metre. It is soluble in water at room temperature.

Exposure: 180 sec. Receiving printing plate: paper receiving printing plate. Transfer operation: in the apparatus according to FIG. 10; the imagewise exposed screen sheet travels through the liquid. Transfer speed: 1.3 m. Transfer pressure: 1.5 kg. Separation: some time after pressing-together. The planographic printing plate formed is negative. If necessary, it is retouched. Finishing: the printing plate is kept for 3 min. at 145° C., and, after cooling its image side is treated for 1 min. with fixing solution.

With the finished printing plate, negative offset prints are obtained. Here "negative" naturally implies: "negative with respect to the original from which the copy was made." When this original is itself a negative, the offset prints consequently will be positive.

*Example XII*

Screen sheet according to FIGS. 6 and 7. Center distance 9: 35 microns. Light transmission: 6%. The relief surface was deacylated. Composition of the pigment suspension:

120 g. carbon black
15 g. cellulose acetate butyrate
1000 cc. ethyl acetate or, when a red pigment is preferred:

100 g. Lithol Echtscharlach R.N. Pulver
100 cc. of a 10% by weight solution of cellulose acetate butyrate in ethyl acetate
900 cc. ethyl acetate.

In both cases the screen parts are hydrophobic and porous to water.

A casein layer was formed by casting the following slightly ammoniacal solution:

120 g. casein in
1000 cc. water and drying.

The casein layer was sensitized with:

40 g. diazo aldehyde in
1000 cc. water and dried. The layer weighs 2 g./sq. metre. It is water-receptive, swellable with water, and becomes adhesive on wetting with water. It has close contact with the deacylated tops of the relief. Exposure: 60 sec. Receiving printing plate: paper receiving printing plate. Transfer operation: in the apparatus according to FIG. 10; the imagewise exposed screen sheet is wetted. Transfer speed: 1.3 m. Transfer pressure: 1.5 kg. Separation: shortly after pressing-together. The planographic printing plate formed is positive. If necessary, it is retouched. Finishing: the printing plate is kept for 3 min. at 145° C. and, after cooling, the image side treated for 1 min. with fixing solution.

With the finished printing plate, positive offset prints are obtained.

*Example XIII*

Screen sheet according to FIGS. 6 and 7. Center distance 9: 40 microns. Light transmission: 5%. The relief surface was deacylated. Composition of the pigment suspension:

200 g. carbon black
50 g. asphalt
1000 cc. xylene

The screen parts are hydrophobic and porous to water. The light-sensitive layer was formed by casting:

300 cc. "Le Page" fish glue solution and
20 g. diazo aldehyde in
700 cc. water and drying. The layer weighs 2–2.5 g./sq. metre. It is soluble in water at room temperature. It has close contact with the deacylated tops of the relief.

Exposure: 60 seconds. Receiving printing plate: paper receiving printing plate. Transfer operation: the imagewise exposed screen sheet is immersed for about 20 sec. and then pressed together with the receiving printing plate. Transfer speed: 3 m. Transfer pressure: 2 kg. Separation: shortly after pressing-together.

The planographic printing plate formed is negative. If necessary, it is retouched.

Finishing: the printing plate is kept for 5 min. at 160° C., cooled, treated with fixing solution and dried.

With the finished printing plate, negative offset prints are obtained.

The process of the example is adapted for making positive offset prints from a negative original.

*Example XIV*

Screen sheet according to FIGS. 6 and 7. Center distance 9: 60 microns. Light transmission: 7.5%. The relief surface was deacylated. Composition of the pigment suspension:

200 g. carbon black
32 g. asphalt
400 cc. of a 3% by weight solution of cellulose acetate butyrate in ethyl acetate
48 cc. propylene glycol
1000 cc. xylene The screen parts are hydrophobic and porous to water. The light-sensitive layer was formed by casting:

75 g. of an uncompletely deacylated polyvinyl acetate of the "Elvanol" type, grade 31–31, 76–79% hydrolysed, of Du Pont de Nemours & Co., Wilmington, Delaware, U.S.A., and
10 g. diazo aldehyde in
1000 cc. water and drying. The layer weighs 2.5–3 g./sq. metre. It is water-receptive, and becomes adhesive on wetting wtih water. It has close contact with the deacylated tops of the relief.

Exposure: 50 sec. Receiving printing plate: paper receiving printing plate. Transfer operation: in the apparatus according to FIG. 10; the receiving printing plate is wetted. Transfer speed: 2 m. Transfer pressure: 3.5 kg. Separation: shortly after pressing-together. The planographic printing plate formed is positive. If necessary, it is retouched. Finishing: the printing plate is kept for 8 min. at 160° C. and cooled.

With the finished printing plate, positive offset prints are obtained.

*Example XV*

Screen sheet according to FIGS. 6 and 7. Center distance 9: 90 microns. Light transmission: 10%. The relief surface was deacylated. Composition of the pigment suspension:

200 g. carbon black
50 g. asphalt
1000 cc. xylene.

The screen parts are hydrophobic and porous to water. The light-sensitive layer was formed by casting:

100 g. blood albumen in
1000 cc. water and, after drying, impregnating the layer obtained with:

40 g. diazo aldehyde in
200 cc. water and
800 cc. methyl alcohol and drying. The layer weighs 3.5 g./sq. metre. It is water-receptive and becomes adhesive on wetting with water. It has close contact with the deacylated tops of the relief. Exposure: 70 sec. Receiving printing plate: paper receiving printing plate. Transfer operation: in the apparatus according to FIG. 10; the transfer liquid consists of a mixture of equal parts of water and ethyl alcohol; and the imagewise exposed screen sheet is wetted therewith. Transfer speed: 1.8 m. Transfer pressure: 1.7 kg. Separation: shortly after pressing-together. The planographic printing plate formed is positive. If necessary, it is retouched.

Finishing: the printing plate is kept for 8 min. at 160° C. and cooled.

With the finished printing plate, positive offset prints are obtained.

*Example XVI*

Screen sheet according to FIGS. 6 and 7. Center distance 9: 50 microns. Light transmission: 6%. The relief surface was not deacylated. Composition of the pigment suspension:

240 g. carbon black
90 g. cellulose acetate butyrate
1000 cc. ethyl acetate.

The screen parts are hydrophobic. The screen surface was sensitized with the following solution:

20 g. diazo aldehyde in
200 cc. water and
800 cc. methyl alcohol and dried.

Exposure: 75 sec. Receiving printing plate: finely grained aluminum printing plate. Transfer operation: in the apparatus according to FIG. 10; the transfer liquid consists of ethyl acetate and the imagewise exposed screen sheet is wetted therewith. Transfer speed: 2.5 m. Transfer pressure: 1.7 kg. Separation: shortly after pressing-together. The planographic printing plate formed is positive. If necessary, it is retouched. Finishing: the printing plate is treated with fixing solution and dried.

If in the finishing operation the printing plate is first kept for 10 min. at 150° C. and then treated in the manner described above, it is more suitable for printing a large number of copies.

With the finished printing plate, positive offset prints are obtained.

Instead of ethyl acetate, the following transfer liquid may be used: iso-propyl acetate, benzene, 2-nitropropane, trichloro-ethylene and propylene dichloride while varying, as the case may require, the transfer speed and/or the time between pressing-together and separation.

*Example XVII*

Screen sheet according to FIGS. 6 and 7. Center distance 9: 80 microns. Light transmission: 12%. The relief surface was deacylated. Composition of the pigment suspension:

200 g. carbon black
40 g. asphalt
1000 cc. xylene.

The screen parts are hydrophobic and porous to water. The light-sensitive layer was formed by casting:

80 g. gelatin and
50 g. anthraquinone disulphonic acid-2.7 in 1000 cc. water and drying. The layer weighs approximately 3.5 g./sq. metre. It is water-receptive, swellable with water, and becomes adhesive on wetting with water. It has close contact with the deacylated tops of the relief.

Exposure: 120 sec., copying by direct exposure under a tracing according to FIG. 1, arrow 6'. Receiving printing plate: paper receiving printing plate. Transfer operation: the imagewise exposed screen sheet is immersed for 30 sec. in:

20 g. potassium bichromate in
1000 cc. water, rinsed with water, and then pressed together with the receiving printing plate.

Transfer speed: 2.5 m. Transfer pressure: 1.25 kg. Separation: shortly after pressing-together. The planographic printing plate formed is negative. If necessary, it is retouched. Finishing: the printing plate is wetted, inked, treated with fixing solution, and dried. With the finished printing plate, negative offset prints are obtained.

*Example XVIII*

Screen sheet according to FIGS. 6 and 7. Center distance 9: 50 microns. Light transmission: 10%. The relief surface was deacylated. Composition of the pigment suspension:

120 g. carbon black
15 g. cellulose acetate butyrate
1000 cc. ethyl acetate.

The screen parts are hydrophobic and porous to water. A slightly hardened gelatin layer was formed by casting:

80 g. gelatin and
1.25 g. diazo aldehyde in
1000 cc. water, drying, and exposing. The gelatin layer thus formed was impregnated with:

50 g. p-dimethylaminobenzene diazonium chloride zinc chloride double salt in
1000 cc. water and dried. The layer weighs approximately 3 g./sq. metre. Although to a less extent than the light-sensitive gelatin layers of some other examples, this layer still is water-receptive, swellable with water, and becomes adhesive on wetting with water. It has close contact with the deacylated tops of the relief.

Exposure: 40 sec., copying by direct exposure under a tracing according to FIG. 1, arrow 6'. Receiving printing plate: finely grained aluminium printing plate. Transfer operation: the imagewise exposed screen sheet is immersed for 10 sec. in:

20 g. potassium bichromate in
1000 cc. water, rinsed with water, and then pressed together with the receiving printing plate. Transfer speed: 2 m. Transfer pressure: 1 kg. Separation: shortly after pressing-together. The planographic printing plate formed is positive. If necessary, it is retouched. Finishing: the printing plate is kept for 10 min. at 150° C., cooled, treated for 1.5 min. with fixing solution, and dried.

With the finished printing plate, positive offset prints are obtained.

*Example XIX*

Screen sheet according to FIGS. 6 and 7. Center distance 9: 40 microns. Light transmission: 6%. The relief surface was deacylated. Composition of the pigment suspension:

120 g. carbon black
15 g. cellulose acetate butyrate
1000 cc. ethyl acetate.

The screen parts are hydrophobic and porous to water. The light-sensitive layer was formed by casting:

80 g. gelatin
20 g. diazo aldehyde
20 g. magnesium sulphate in
1000 cc. water and drying. The layer weighs 3 g./sq. metre. It is water-receptive, swellable with water, and becomes adhesive on wetting with water. It has close contact with the deacylated tops of the relief. Exposure: 60 sec. Receiving printing plate: a bi-metal plate (a stainless steel plate having on one of its sides a thin layer of copper). Transfer operation: the bi-metal plate is wetted and pressed with its copper surface against the imagewise exposed screen sheet. Transfer speed: 2 m. Transfer pressure: 1.8 kg. Separation: shorting after pressing-together. The planographic printing plate formed is positive. If necessary, it is retouched. Finishing: the printing plate is etched with ferric chloride solution (40° Bé.) until the copper layer has disappeared except under the transferred screen parts, which serve as a "resist," and thoroughly washed in running water; the transferred screen parts are removed until the positive copper image becomes visible on the stainless steel plate, the plate is dried and provided with a thin layer of offset printing ink, the ink is removed from the stainless steel surface by washing with a sponge, soaked in:

50 g. copper nitrate
50 cc. hydrochloric acid (s.g. 1.19)
50 cc. nitric acid (s.g. 1.13) in
900 cc. water and the plate is rinsed with water and dried.

With the printing plate thus finished, positive offset prints are obtained.

What I claim is:

1. A printing plate comprising a support formed with a printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct porous hydrophobic solid outer layer, said underlayer adhering to said surface and binding thereto said outer layer and being itself substantially free of pigment, said outer layer of each of said elements being composed of deposits of hydrophobic solid matter which are permeated with liquid-receptive pores and interspersed with minute light pervious areas uniformly spaced apart at a center distance of between 20 and 100 microns.

2. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct hydrophobic solid outer layer, said underlayer adhering to said surface and binding thereto said outer layer and being itself substantially free of pigment, said outer layer of each of said elements being composed of liquid-permeable porous deposits of hydrophobic solid matter which are uniformly interspersed with minute light pervious areas through which light may be passed to the corresponding underlayer, said light pervious areas being spaced apart at a center distance of between 20 and 100 microns.

3. A printing plate comprising a support formed with a printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct porous hydrophobic solid outer layer, said underlayer adhering to said surface and binding thereto said outer layer and being itself substantially free of pigment, said underlayer being continuous and confined only within the area of said element, said outer layer of each of said elements being composed of deposits of hydrophobic solid matter which are permeated with liquid-receptive pores and interspersed with minute openings uniformly spaced apart at a center distance of between 20 and 100 microns.

4. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct porous hydrophobic solid outer layer, said underlayer adhering to said surface and binding thereto said outer layer and being itself substantially free of pigment, said underlayer being continuous and confined only within the area of said element, said outer layer of each of said elements being a coherent layer of hydrophobic solid matter permeated with liquid-receptive pores and regularly interrupted by a myriad of minute openings extending entirely through said outer layer and uniformly spaced apart at a center distance of between 20 and 100 microns.

5. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct porous hydrophobic solid outer layer, said underlayer adhering to said surface and binding thereto said outer layer and being itself substantially free of pigment, said underlayer being continuous and confined only within the area of said element, said outer layer of each of said elements being composed of a mixture of a major proportion of a finely divided hydrophobic pigment and a minor proportion of a hydrophobic binder in the form of coherent deposits of said hydrophobic mixture which are permeated with liquid-receptive pores and interspersed with minute openings uniformly spaced apart at a center distance of between 20 and 100 microns.

6. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film forming colloid material and a distinct porous hydrophobic solid outer layer, said underlayer adhering to said surface and binding thereto said outer layer and being itself substantially free of pigment, said underlayer being continuous and confined only within the area of said element, said outer layer of each of said elements being composed of deposits of hydrophobic solid matter which are permeated with liquid receptive pores and are interspersed with minute openings uniformly spaced apart at a center distance of between 20 and 100 microns, said colloid material comprising a water resistant product of an insolubilizing treatment of a mixture of a hydrophilic colloidal binder and a compound selected from the group consisting of light sensitive diazo compounds and light sensitive azido compounds.

7. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct porous hydrophobic solid outer layer, said underlayer adhering to said surface and binding thereto said outer layer and being itself substantially free of pigment, said underlayer being continuous and confined only within the area of said element, said outer layer of each of said elements being composed of deposits of hydrophobic solid matter which are permeated with liquid-receptive pores and interspersed with minute openings uniformly spaced apart at a center distance of between 20 and 100 microns, said colloid material being a water resistant product of the baking of a mixture of a hydrophilic colloidal binder and a light sensitive compound selected from the group consisting of light sensitive diazo compounds and light sensitive azido compounds.

8. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct porous hydrophobic solid outer layer, said underlayer adhering to said surface and binding thereto said outer layer and being itself substantially free of pigment, said underlayer being continuous and confined only within the area of said element, said outer layer of each of said elements being composed of deposits of hydrophobic solid matter which are permeated with liquid-receptive pores and interspersed with minute openings uniformly spaced apart at a center distance of between 20 and 100 microns, said colloid material comprising a water resistant mixture of a tanned colloid and a compound selected from the group consisting of light sensitive diazo compounds and light sensitive azido compounds and decomposition products thereof.

9. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct porous hydrophobic solid outer layer, said underlayer adhering to said surface and binding thereto said outer layer and being itself substantially free of pigment, said underlayer being continuous and confined only within the area of said element, said outer layer of each of said elements being composed of deposits of hydrophobic solid matter which are permeated with liquid-receptive pores and interspersed with minute openings uniformly spaced apart at a center distance of between 20 and 100 microns, said colloid material comprising a water resistant product of the exposure to actinic light of a mixture of a hydrophilic colloidal binder and a compound selected from the group consisting of light sensitive diazo compounds and light sensitive azido compounds.

10. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of organic film-forming colloid material and a distinct porous hydrophobic solid outer layer, said underlayer adhering to said surface and binding thereto said outer layer and being itself substantially free of pigment, said underlayer being continuous and confined only within the area of said elements, said outer layer of each of said elements being composed of deposits of hydrophobic solid matter which are permeated with liquid-receptive pores and interspersed with minute openings uniformly spaced apart at a center distance of between 20 and 100 microns, said colloid material comprising a water resistant mixture of a colloidal binder and a hydrophobic azo dyestuff.

11. A planographic printing plate comprising a support formed with a hydrophilic printing surface bearing greasy-ink receptive printing elements in the pattern of a photographic image of an original to be reproduced, each of said elements corresponding in outline to an element of said image and being a torn-out portion of a layer structure common to said elements and being formed of an underlayer consisting essentially of hydrophobic organic film-forming colloid material and a distince porous hydrophobic solid outer layer, said underlayer adhering to said surface and binding thereto said outer layer and being itself substantially free of pigment, said underlayer being continuous and confined only within the area of said element, said outer layer of each of said elements being composed of a myriad of uniform deposits of hydrophobic solid matter which are permeated with liquid-receptive pores and interspersed with minute openings uniformly spaced apart at a center distance of between 20 and 100 microns, said colloid material comprising a water repellant mixture of a hydrophobic colloidal binder and a compound selected from the group consisting of light sensitive diazo compounds and light sensitive azido compounds and decomposition products thereof.

12. A planographic printing plate comprising a support formed with a hydrophilic printing surface bearing greasy-ink-receptive printing elements in the pattern of a photographic image of an original to be reproduced, each of said elements corresponding in outline to an element of said image and being a torn-out portion of a layer structure common to said slements and being formed of an underlayer consisting essentially of organic film-forming colloid material and a distinct porous hydrophobic solid outer layer, said underlayer adhering to said surface and binding thereto said outer layer and being itself substantially free of pigment, said outer layer of each of said elements being a coherent layer of hydrophobic solid matter permeated with liquid-receptive pores and regularly interrupted by a myriad of uniform light pervious openings extending entirely through said outer layer and uniformly spaced apart at a center distance of between 20 and 100 microns, said hydrophobic matter being a mixture of a major proportion of a finely divided hydrophobic pigment and a minor proportion of a hydrophobic binder, said colloid material being a water resistant product of an insolubilizing treatment of a mixture of gelatin and a light sensitive condensation product of formaldehyde and a para-diazo-diphenylamine.

References Cited in the file of this patent

UNITED STATES PATENTS

| | | |
|---|---|---|
| 1,118,479 | Dodge | Nov. 24, 1914 |
| 1,166,540 | Orans | Jan. 4, 1916 |
| 1,618,505 | Beebe et al. | Feb. 22, 1927 |
| 1,762,033 | Schmidt et al. | June 3, 1930 |
| 1,918,560 | Rehlander | July 18, 1933 |
| 2,026,292 | Van der Grinten | Dec. 31, 1935 |
| 2,051,585 | Van der Grinten | Aug. 10, 1936 |
| 2,100,063 | Zahn | Nov. 23, 1937 |
| 2,295,632 | Buskes | Sept. 15, 1942 |
| 2,532,390 | Bennett et al. | Dec. 5, 1950 |
| 2,596,756 | Yutzy et al. | May 13, 1952 |
| 2,602,740 | Van der Grinten | July 8, 1952 |
| 2,692,827 | Brinnick | Oct. 26, 1954 |
| 2,714,066 | Jewett et al. | July 26, 1955 |
| 2,747,999 | Yutzy et al. | May 29, 1956 |
| 2,754,279 | Hall | July 10, 1956 |
| 2,763,553 | Clark et al. | Sept. 18, 1956 |

FOREIGN PATENTS

| | | |
|---|---|---|
| 27,665 | Great Britain | Nov. 28, 1909 |
| 904,255 | France | Feb. 19, 1945 |

UNITED STATES PATENT OFFICE

CERTIFICATE OF CORRECTION

Patent No. 3,010,389 November 28, 1961

Willem Marie Buskes

It is hereby certified that error appears in the above numbered patent requiring correction and that the said Letters Patent should read as corrected below.

Column 1, line 69, for "process" read -- processes --; column 10, line 44, for "paritcular" read -- particular --; column 18, line 65, for "15 kg." read -- 1.5 kg. --; column 21, line 54, for "unites" read -- united --; column 22, line 32, for "finising" read -- finishing --; column 24, line 36, for "treated" read -- treating --; column 27, line 67, for "shorting" read -- shortly --; column 30, line 75 and column 31, line 1, for "distince" read -- distinct --; column 31, line 22, for "slements" read -- elements --.

Signed and sealed this 17th day of April 1962.

(SEAL)
Attest:

ESTON G. JOHNSON
Attesting Officer

DAVID L. LADD
Commissioner of Patents